US006574776B1

United States Patent
Chiang

(10) Patent No.: US 6,574,776 B1
(45) Date of Patent: Jun. 3, 2003

(54) SIMULTANEOUS PROCESSING FOR ERROR DETECTION AND P-PARITY ECC ENCODING

(75) Inventor: Kevin Chiang, Fremont, CA (US)

(73) Assignee: Oak Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/289,247

(22) Filed: Apr. 9, 1999

(51) Int. Cl.[7] .................... G06F 11/00; H03M 13/00
(52) U.S. Cl. ............................................ 714/800
(58) Field of Search ................... 714/800, 765, 714/775, 218, 758, 746, 761–763, 755, 757, 784–785; 360/48, 60; 700/1; 710/2, 29, 52

(56) References Cited

U.S. PATENT DOCUMENTS

| | | | | |
|---|---|---|---|---|
| 4,413,339 A | * | 11/1983 | Riggle et al. ............... | 714/765 |
| 4,555,784 A | * | 11/1985 | Wood .......................... | 714/785 |
| 4,951,284 A | * | 8/1990 | Abdel-Ghaffar et al. .... | 714/761 |
| 5,361,266 A | * | 11/1994 | Kodama et al. ............. | 714/758 |
| 5,577,054 A | * | 11/1996 | Pharris ........................ | 714/762 |

OTHER PUBLICATIONS

Kuo et al. (Concurrent error detection and correction in real–time systolic sorting arrays; IEEE, On pp.: 1615–1620, Dec. 1992).*
Cosentino, R.J (Concurrent error correction in systolic architectures; IEEE, On pp.: 117–125, Jan. 1988).*
Parallel error–trapping and error–detection decoding;—Lee, P. Chang, S.; IEEE, pp.: 35–38 vol. 1; Nov. 4–6, 1991.*

* cited by examiner

Primary Examiner—Albert Decady
Assistant Examiner—Guy Lamarre
(74) Attorney, Agent, or Firm—John F. Schipper

(57) ABSTRACT

Method and system for receiving each data element of an N×M array once and simultaneously forming an EDC error detection term and two ECC P-parity checkbytes for the array. Each data element is read once from memory and is received by an EDC processor and by an ECC processor and processed in parallel by the two processors to form the EDC error detection term and two ECC P-parity checkbytes.

24 Claims, 10 Drawing Sheets

SIMULTANEOUS PROCESSING FOR ERROR DETECTION AND P-PARITY ECC ENCODING

FIELD OF THE INVENTION

This invention relates to processing of data information in an error control procedure.

BACKGROUND OF THE INVENTION

In parity-based error control procedures that are presently used, data representing a "bare" message, without error control bytes attached thereto, are read from memory three times: once to calculate an error detection control (EDC) segment, once to calculate a P-parity checkbyte, and once to calculate a Q-parity checkbyte. Each read operation requires a certain time increment, and this triple reading of each data byte adds substantially to the total time required to perform error detection and correction procedures on a given data block.

What is needed is an approach that reduces the number of times a given array of data elements must be read from memory, without substantially increasing the time required for subsequent processing of the data for error control purposes. Preferably, the approach should be flexible enough to allow each data element received to be used for more than one computation and should not require that the error control procedures be performed in a particular order. Preferably, the approach should extend to data element arrays of arbitrary size.

SUMMARY OF THE INVENTION

These needs are met by the invention, which provides a modified procedure for using an array of data elements, each read once from memory, received separately at an EDC processor and at an ECC P-parity processor, and processed in parallel in the two processors to compute an EDC error detection term and, simultaneously, to compute two ECC P-parity syndromes s0 and s1. A first procedure is used at the EDC processor to compute the EDC term by receiving the sequence $\{s(k)\}$ of data elements (k=0, 1, ..., 1117) in serial order and computing the EDC factor as the data elements are received. A second procedure is used in parallel at the ECC processor to compute components of the two ECC syndromes as the data elements are received in serial order. Because the two processors operate independently but in parallel, the time required for combined EDC and ECC processing is approximately half of what would otherwise be required, and each data element s(k) need only be read once from memory.

BRIEF DESCRIPTION OF THE DRAWINGS

FIGS. 4A–C and 5A–C are flow charts illustrating suitable procedures for practicing the invention.

DESCRIPTION OF THE INVENTION

Figure 1:
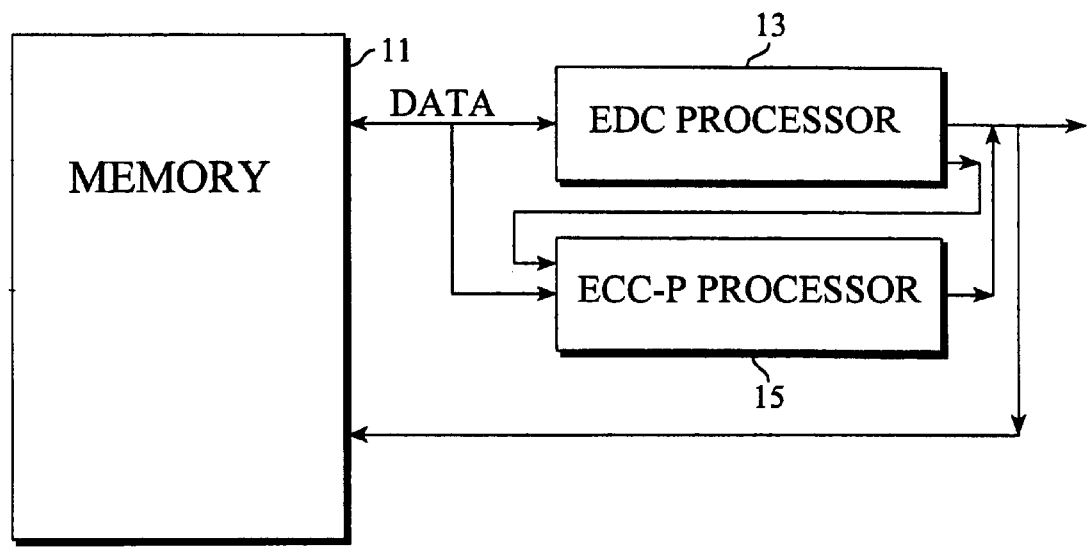
FIG. 1 is a schematic view illustrating use of a data block for EDC and P-parity purposes.

FIG. 1 schematically illustrates processing of a data block, read once from memory, for EDC purposes and for ECC-P-parity purposes. Data (16-bit in this instance) are read from a memory unit 11 are received by an EDC processor unit 13, and part of the processed data are received by an ECC-P-parity processor unit 15. The data read from memory are simultaneously received by the ECC-P-parity processor unit 15 that computes ECC-P-parity syndromes and checkbytes for the data stream. The calculated P-parity syndrome components are stored in a register or local memory, for subsequent use. Because the EDC is a cyclic code, it must be computed in a particular order or sequence.

Figure 2:
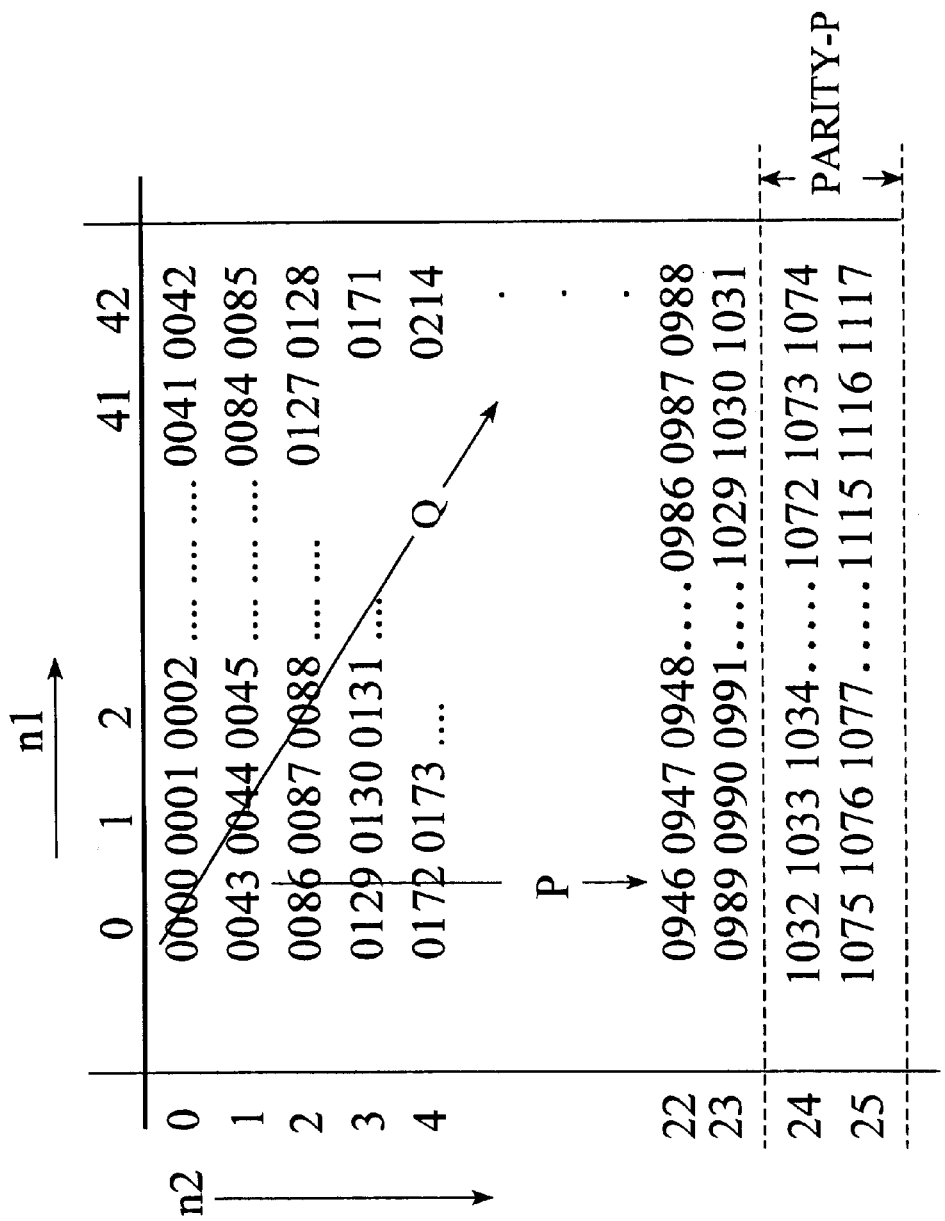
FIG. 2 illustrates a typical format for an array of 16-bit data elements (24×43), plus a format for two ECC P-parity checkbytes.

The P-parity test for ECC augments each column of the 43-column array shown in FIG. 2 with two words (each a double byte), representing components of P-parity checkbytes, c0 and c1, so that each augmented column is now 26×1 Each of the two new rows, representing c0 and c1, is a 1×43 array, as indicated in FIG. 2. Each column entry for the checkbytes c0 and c1 is computed using linear processes involving only the data entries S(x) in the corresponding column for that checkbyte component. Thus, once all elements in a particular column, such as column 3, containing the data elements s(0002), s(0045), s(0088), ..., s(0991), is read in, the checkbyte components for c0 and c1 contributed by that column can be computed. The ECC P-parity check involves powers $\alpha^h$ (h=0, 1, ...) of an eight-bit primitive or array $\alpha$, that satisfies a selected primitive polynomial relation $$p(\alpha)=0. \tag{1}$$

For example, the primitive polynomial relation may be selected to be $$p(\alpha)=\alpha^8+\alpha^4+\alpha^3+\alpha^2+1=0, \tag{2}$$

in which event the "0" element, the "1" element and several powers of $\alpha$ become $$0=\{0,0,0,0,0,0,0,0\},$$

$$\alpha^0=\{0,0,0,0,0,0,0,1\}(="1"),$$

$$\alpha=\{0,0,0,0,0,0,1,0\},$$

$$\alpha^2=\{0,0,0,0,0,1,0,0\},$$

$$\alpha^3=\{0,0,0,0,1,0,0,0\},$$

$$\alpha^4=\{0,0,0,1,0,0,0,0\},$$

$$\alpha^5=\{0,0,1,0,0,0,0,0\},$$

$$\alpha^6=\{0,1,0,0,0,0,0,0\},$$

$$\alpha^7=\{1,0,0,0,0,0,0,0\},$$

$$\alpha^8=\{0,0,0,1,1,1,0,1\}=\alpha^4+\alpha^3+\alpha^2+1,$$

$$\alpha^9=\{0,0,1,1,1,0,1,0\}=\alpha\cdot\alpha^8=\alpha^5+\alpha^4+\alpha^3+\alpha,$$

$$\alpha^{25}=\{0,0,0,0,0,0,1,1\},$$

$$\alpha^{230}=\{1,1,1,1,0,1,0,0\},$$

$$\alpha^{231}=\{1,1,1,1,0,1,0,1\},$$

$$\alpha^{230}=\{1,1,1,1,0,1,1,1\},$$

$$\alpha^{255}=\alpha^0=\{0,0,0,0,0,0,0,1\}, \tag{3}$$

where the particular powers $\alpha^h$ (n=230, 231, 232) will be needed in the following development. The remaining powers $\alpha^h$ ($10 \leq h \leq 254$) are generated using the particular primitive polynomial equation (2). Change of the choice of primitive polynomial will cause a corresponding change in definition of some or all of the powers of α.

The particular checkbytes c0 and c1 are formed as follows. Two syndrome variables s0 and s1, each having an upper byte (U) and a lower byte (L), are defined by $$s0[n1]_U = \sum_{n2=0}^{M-1} 1 \cdot s(N \cdot n2 + n1)_U \quad (4U)$$

$$(n1 = 0, 1, \ldots, N-1),$$

$$s0[n1]_L = \sum_{n2=0}^{M-1} 1 \cdot s(N \cdot n2 + n1)_L, \quad (4L)$$

$$s1[n1]_U = \sum_{n2=0}^{M-1} \alpha^{M-1-n2} \cdot s(N \cdot n2 + n1)_U, \quad (5U)$$

$$s1[n1]_L = \sum_{n2=0}^{M-1} \alpha^{M-1-n2} \cdot s(N \cdot n2 + n1)_L, \quad (5L)$$

where, for example, the choices N=43 and M=24 correspond to a particular choice for P-parity error correction. Two check bytes, c0 and c1, are added for every code word to detect up to two errors per code word and to allow correction of up to one error per code word.

The check bytes c0 and c1 satisfy the error check relations $$c1[n1]+c0[n1]+s0[n1]=0, \quad (6)$$

$$c1[n1]+\alpha c0[n1]+\alpha^2 s1[n1]=0. \quad (7)$$

One verifies from the relations (3), (6) and (7) that $$c1[n1]=c0[n1]+s0[n1], \quad (8)$$

$$(1+\alpha) \cdot c0[n1]=s0[n1]+\alpha^2 \cdot s1[n1] \quad (9)$$

$$\begin{aligned} c0[n1] &= (1+\alpha)^{-1} \{s0[n1] + \alpha^2 \cdot s1[n1]\} \\ &= \alpha^{-25} s0[n1] + \alpha^{-23} \cdot s1[n1] \\ &= \alpha^{255-25} \cdot s0[n1] + \alpha^{255-23} \cdot s1[n1] \\ &= \alpha^{230} \cdot s0[n1] + \alpha^{232} \cdot s1[n1], \end{aligned} \quad (10)$$

$$c1[n1]=\alpha^{231} \cdot s0[n1]+\alpha^{232} \cdot s1[n1]. \quad (11)$$

Figure 3:
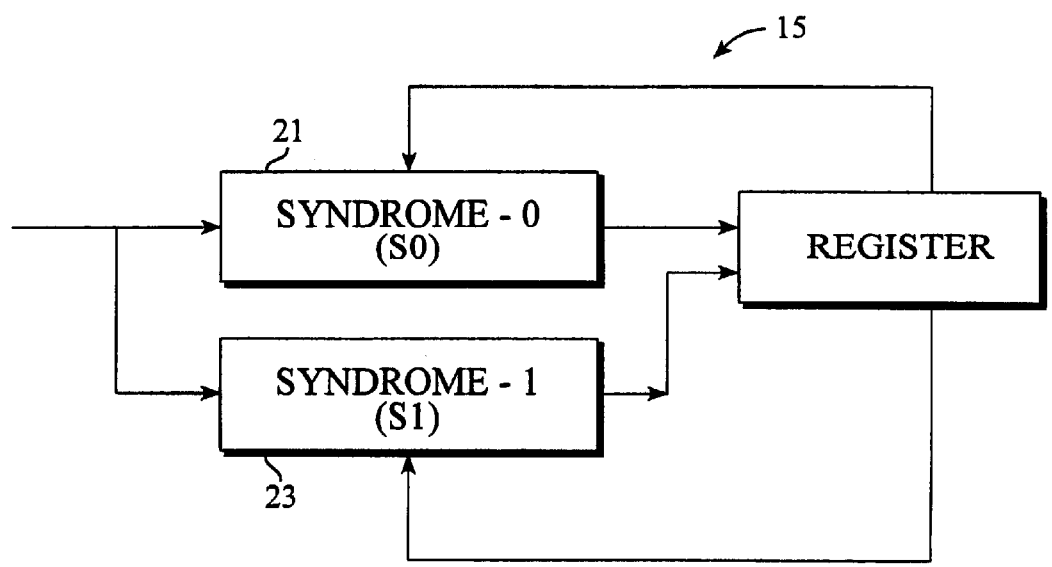
FIG. 3 illustrates processing of data within a P-parity block for computing two ECC-P checkbytes.

FIG. 3 schematically illustrates processing of the received data within the ECC-P-parity processor 15. As a word (two bytes) of data arrives, the word is received simultaneously by a syndrome-0 processor unit 21 and by a syndrome-1 processor unit 23. This processing produces a contribution to the syndromes s0 and s1 defined in (4) and (5), for later computation of the checkbytes c0 and c1. The contributions of this received word to the syndromes s0 and s1 are added to the partial sums for s0 and s1 already in memory, and the new partial sums are returned to memory. This continues until each data element in the 24×43 array has been received and its contributions to the sums s0 and s1 have been computed and added to the partial sums for s0 and s1. Preferably, each column in the 24×43 array in FIG. 2 is read as a unit so that the contributions from each column to the checkbytes c0 and c1 are computed as a unit and placed in rows n2=24, 25 in the array in FIG. 2.

Each data element need only be read in once, and then received and processed separately by the EDC processor 13 and by the ECC-P-parity processor 15 in FIG. 1. The four-byte EDC factor is preferably used as two selected two-byte syndrome components s1[n1] that appear in row 24 in FIG. 2, for example s(1029) and s(1031), in the data stream.

Figure 4A:
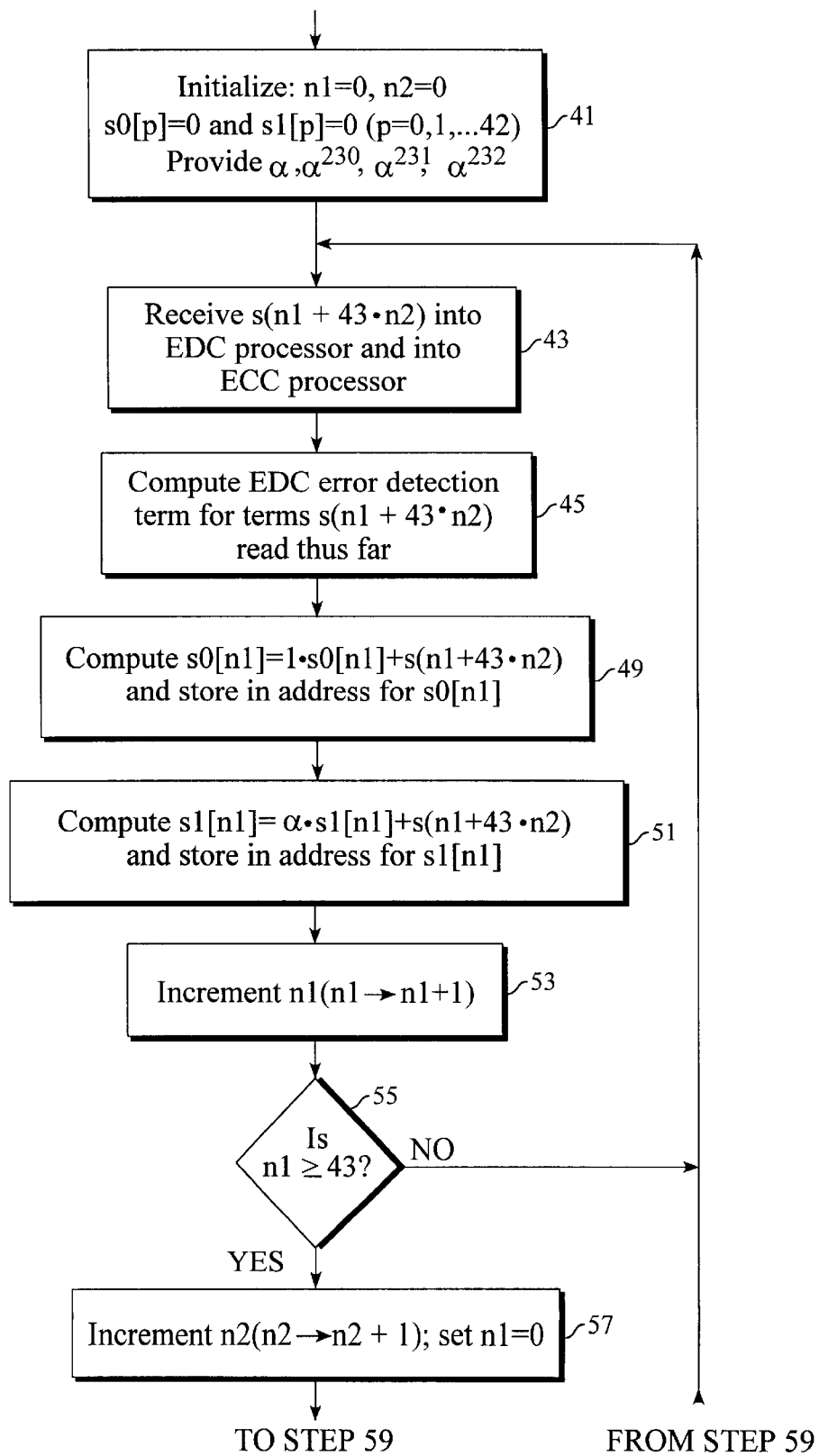
Figure 4B:
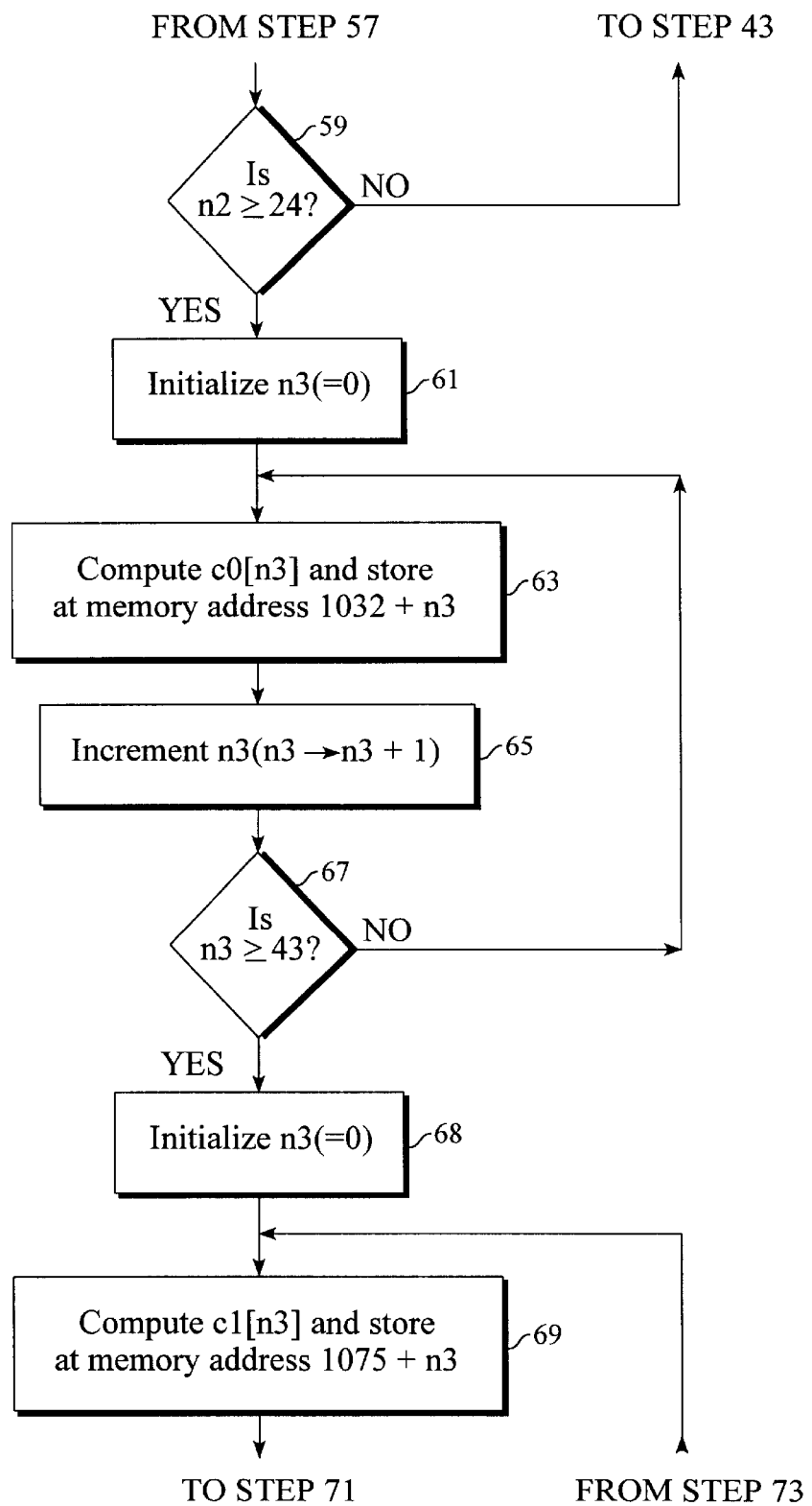
Figure 4C:
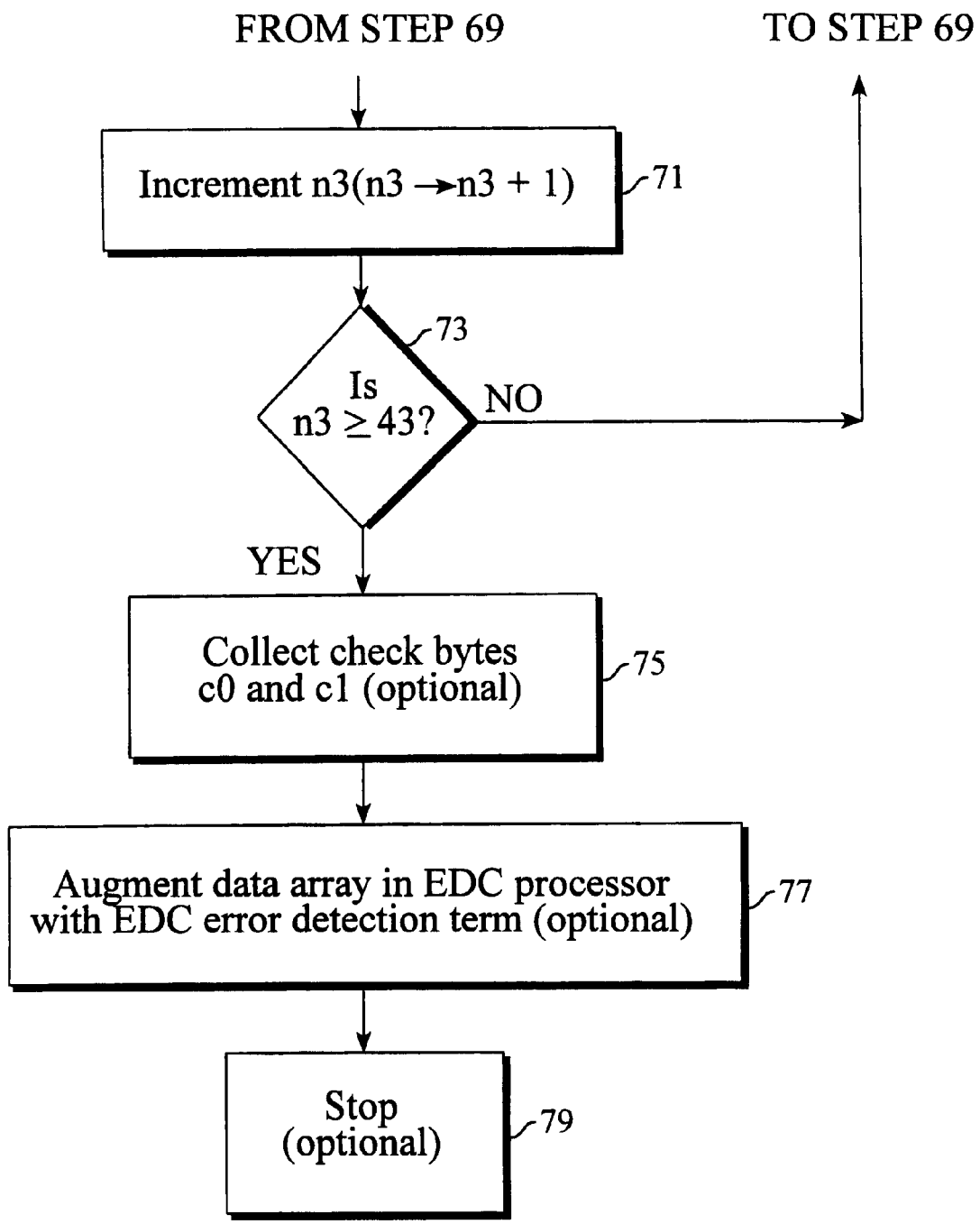

FIG. 4 is a flow chart illustrating a suitable procedure for practicing the invention, with M=24 and N=43. In step 41, a first counting index n1 and second counting index are initialized (n1=n2=0), the 16-bit initial arrays (both 0) for the syndrome components s0[n1] and s1[n1] (n1=0, 1, . . . , 42) are initialized, and selected powers $\alpha^h$ of a selected eight-bit array α are provided (h=1, 230, 231, 232). In step 43, a data element s(n1+43·n2) is received into the EDC processor and, simultaneously, into the ECC processor. In step 45, the EDC factor is computed for the data elements s(n1+43·n2) read thus far.

In step 49, the data element s(n1+43·n2) (upper and lower bytes) is added to s0[n1] to form a new sum, also designated as s0[n1], which is returned to the original location in memory of s0[n1] (optionally multiplied by the array "1"). In step 51, the data element $s(n1+43 \cdot n2)_U$ is added to $\alpha \cdot s1[n1]_U$, where α is the 8-bit array set forth in (5), and the data element $s(n1+43 \cdot n2)_L$ is added to $s1[n1]_L$. The resulting sums, (re)designated as $s1[n1]_U$ and $s1[n1]_L$, are returned to the original location in memory of s1[n1]. Steps 49 and 51 are carried for a low end byte and for a high end byte for each data element s(n1+43·n2) that is read in.

In step 53, the index n2 is incremented (n2→n2+1). In step 55, the system determines whether n2≧26? If the answer to the question in step 55 is "no," the system returns to step 43 at least once and repeats steps 43–55.

If the answer to the question in step 55 is "yes," the index n1 is incremented (n1→n1+1), in step 57, and the index n2 is reset to 0. In step 59, the system determines whether n1≧43? If the answer to the question in step 59 is "no," the system returns to step 43 and repeats steps 43–59 at least once.

If the answer to the question in step 59 is "yes," the system initializes a third counting index n3 (n3=0), in step 61. In step 63, the system computes $c0[n3]=\alpha^{230} \cdot s0[n3]+\alpha^{232} \cdot s1[n3]$ and stores c0[n3] in memory at address 1032+n3. In step 65, the index n3 is incremented (n3→n3+1). In step 67, the system determines whether n3≧43? If the answer to the question in step 69 is "no," the system returns to step 63 and repeats steps 63–67 at least once.

If the answer to the question in step 67 is "yes", the system re-initializes n3 (=0) in step 68. In step 69, the system computes $c1[n3]=\alpha^{231} \cdot s0[n3]+\alpha^{232} \cdot s1[n3]0$ and stores c1[n3] in memory at memory address 1075+n3. In step 71, the index n3 is incremented (n3→n3+1). In step 73, the system determines whether n3≧43? If the answer to the question in step 73 is "no,", the system returns to step 68 and repeats steps 68–73 at least once.

If the answer to the question in step 73 is "yes," the system optionally: collects the checkbytes c0 and c1, in step 75; and/or augments the data array at the EDC processor with the EDC error detection term, stored at a selected memory address, in step 77; and/or stops the procedure, at step 79.

Figure 5A:
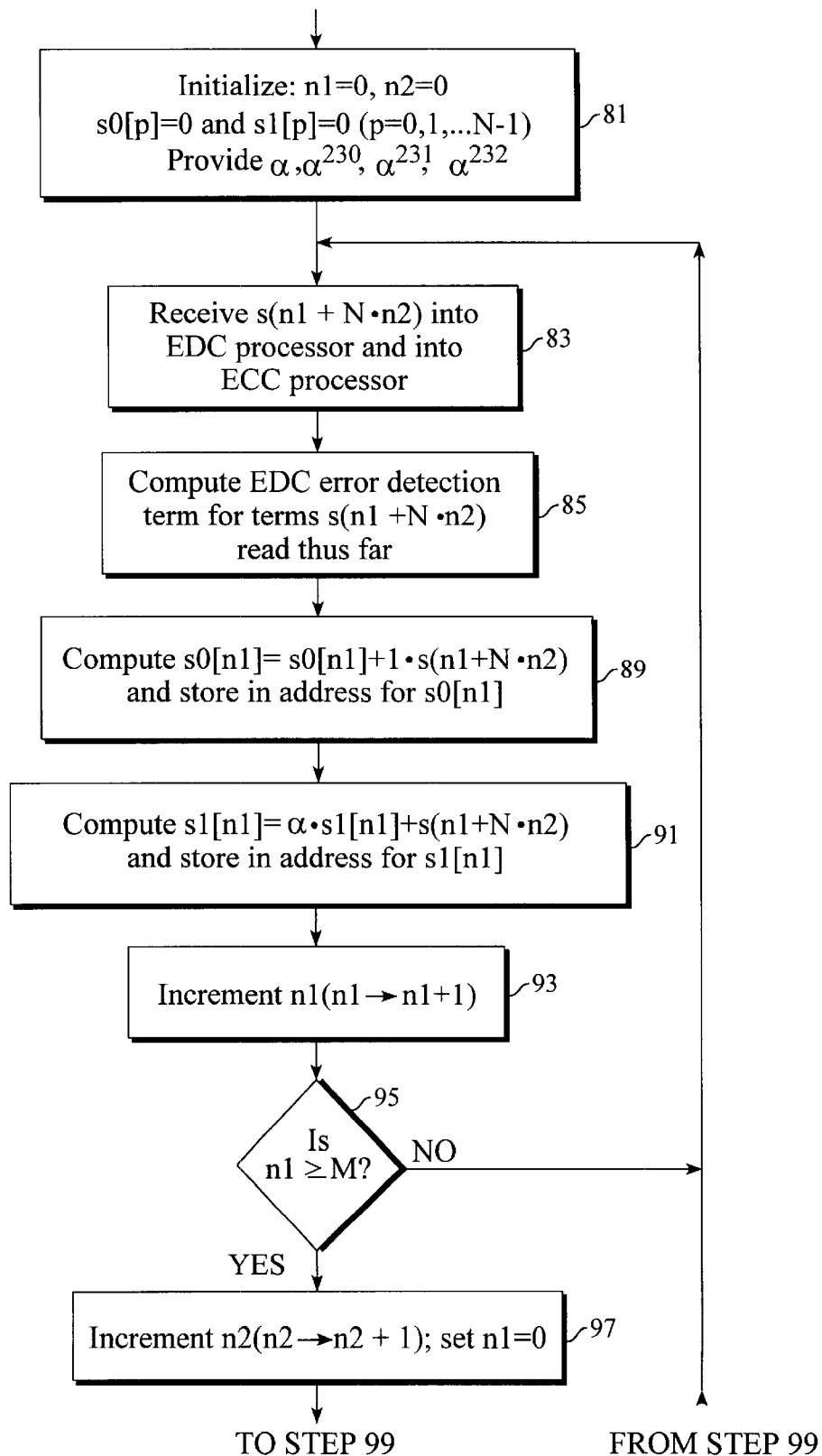
Figure 5B:
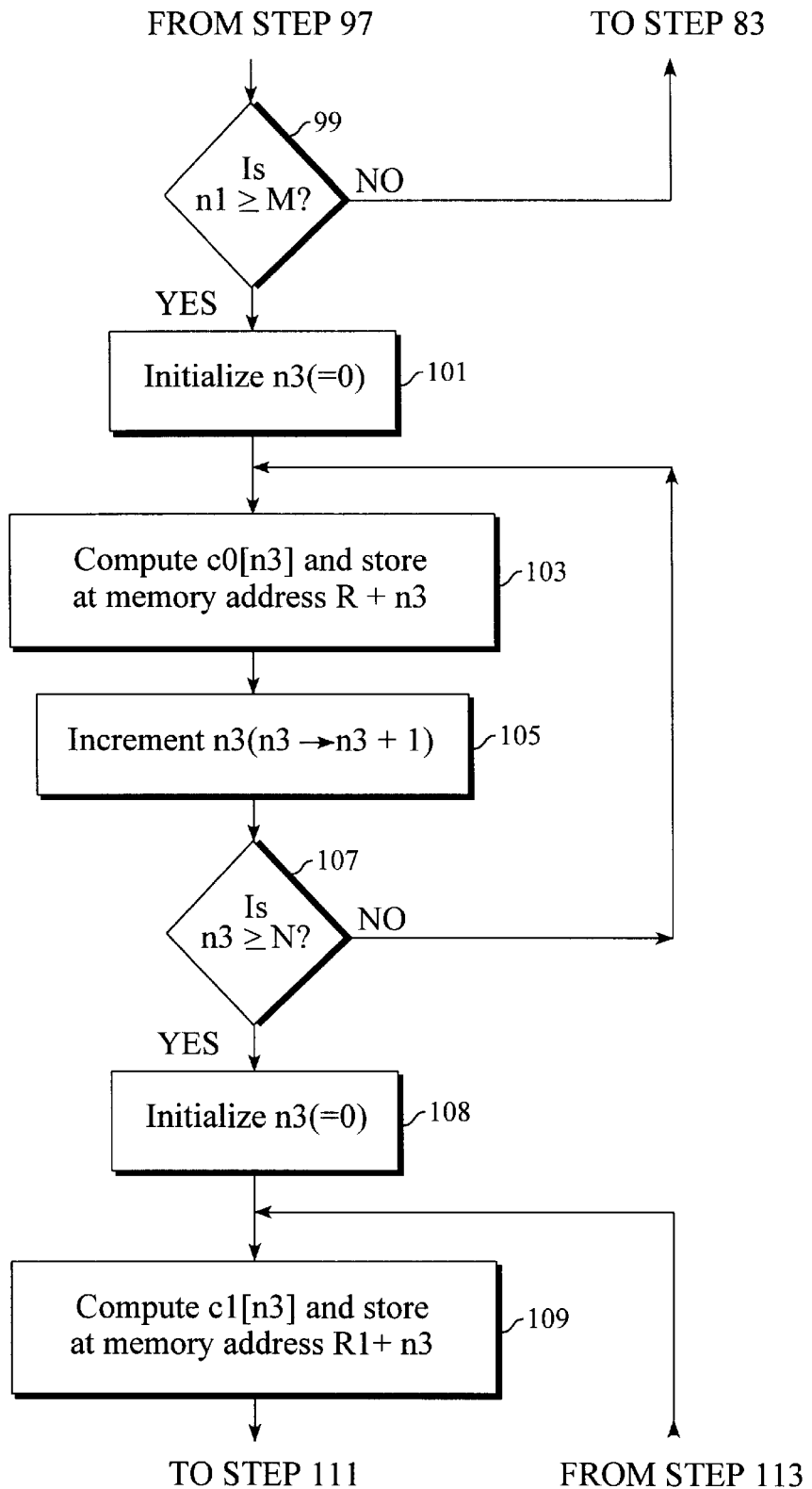

FIG. 5 is a flow chart illustrating a suitable procedure for practicing the invention, with general positive integers M−1, M, N−1, N, R=M·N and R1=(M+1)·N replacing the respective integers 23, 24, 42, 43, 1032 and 1075. The steps 81, 83, 95, 89, 91, 93, 95, 97, 99, 101, 103, 105, 107, 108, 109, 111, 113, 115, 117 and 119 are analogous to the corresponding respective steps 41, 43, 45, 49, 51, 53, 55, 57, 59, 61, 63, 65, 67, 68, 69, 71, 73, 75, 77 and 79.

An EDC encoder computes and provides an error detection factor that is appended to a digital data stream to allow up to a selected number of errors to be identified in the data stream, as received, using a selected EDC polynomial G(x)

for the coding. One suitable choice for the divisor polynomial G(x) is $$G(x)=x^{31}+x^{16}+x^{15}+x^4+x^3+x+1, \quad (12)$$

and this choice is used here for illustrative purposes.

Figure 6C:
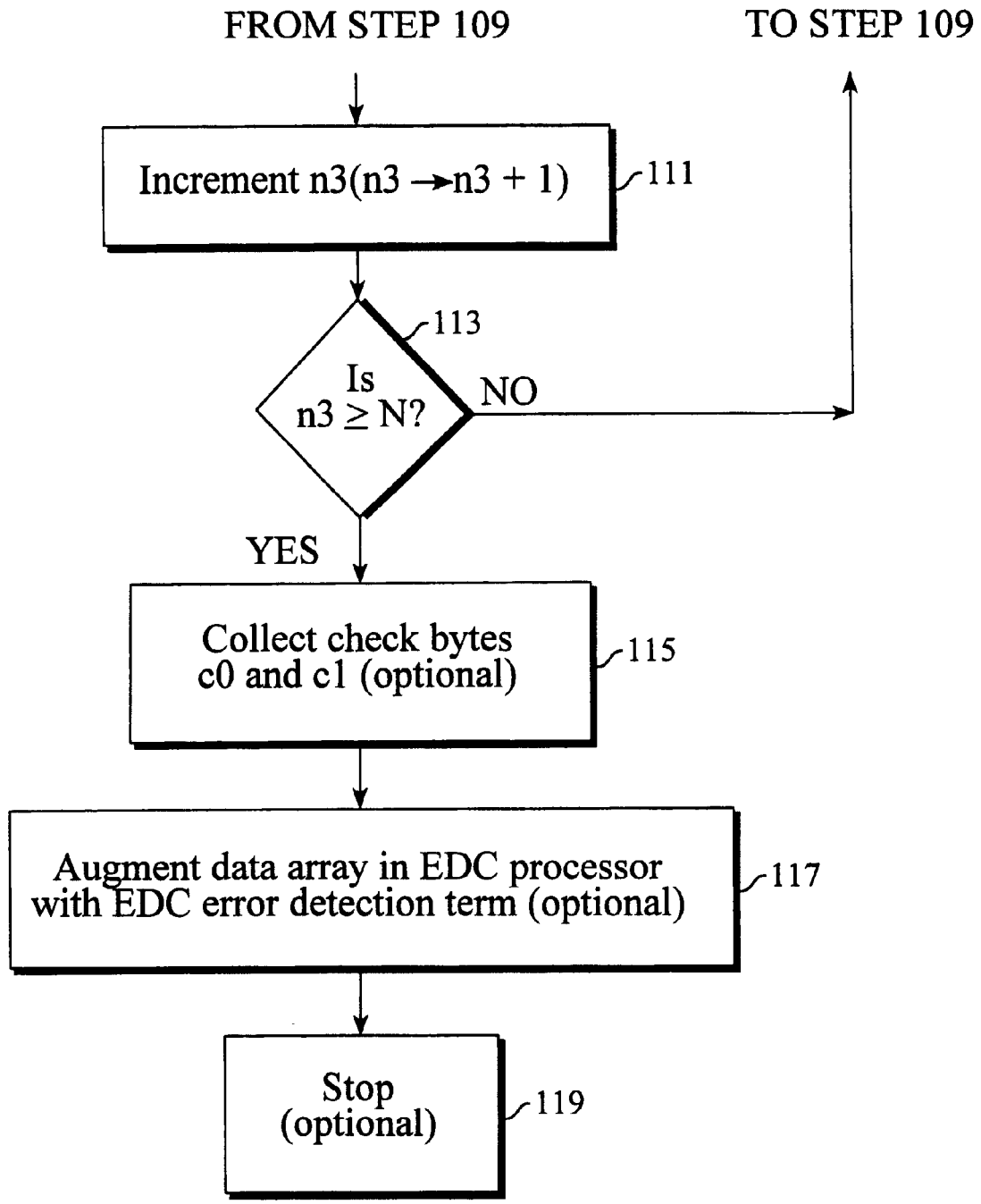
FIGS. 6 and 7 display linear feedback shift register arrangements suitable for EDC coding.
Figure 6:
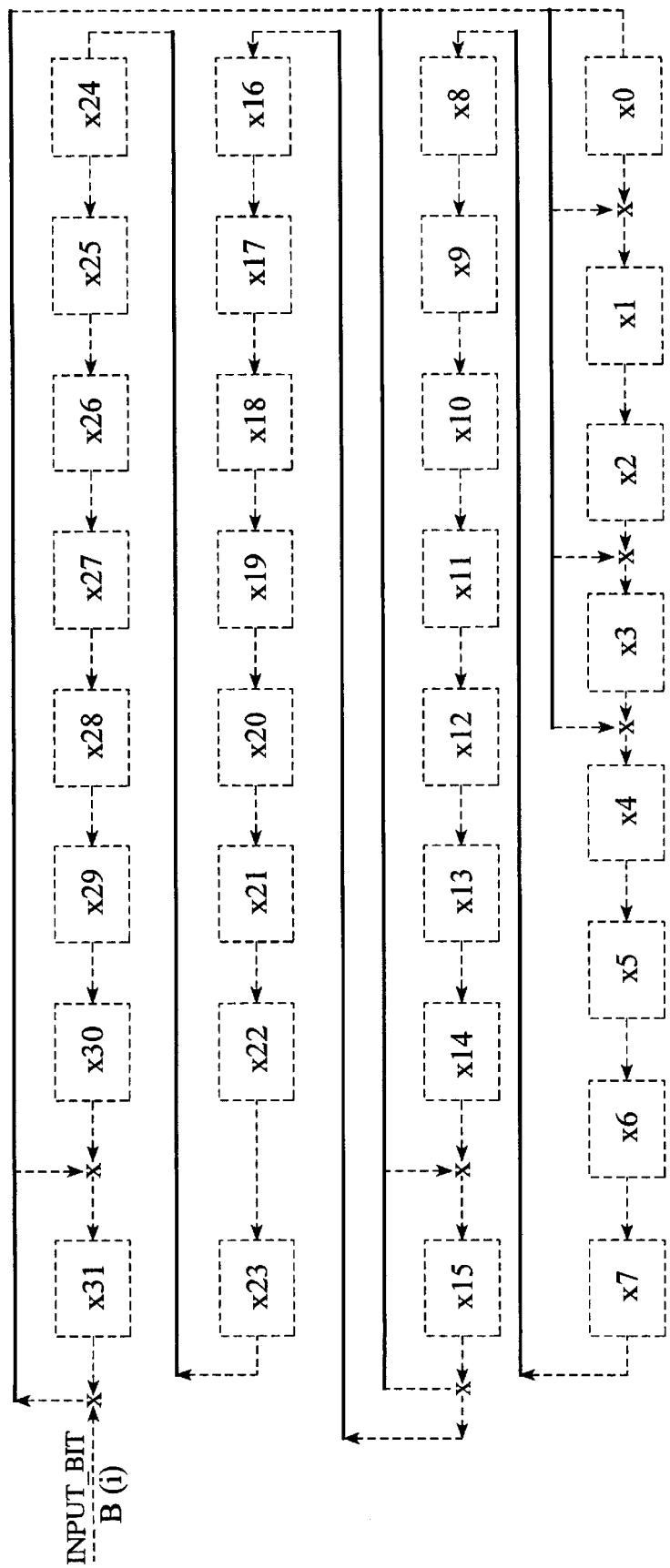

FIG. 6 displays a linear feedback shift register (LFSR), suitably arranged to provide the divisor polynomial G(x). Let $Q_n(i)$ represent the binary value contained in the flipflop number n in FIG. 6 (n=0, 1, . . . , 31) at a cycle time i (i=0, 1, 2, . . . ), and let B(i) be the ith binary value in a sequence of such values that are part of the digital data stream (arriving from the left). Each flip flop n contains a selected initial binary value at cycle time i=0. Three relations define the values contained in each flipflop at any later cycle time (i≧1):

$$Q_0(i)=B(i-1)\oplus Q_{31}(i-1), \quad (13)$$

$$Q_m(i)=B(i-1)\oplus Q_{31}(i-1)\oplus Q_{m-1}(i-1)(m=1,3,4,15,16,31), \quad (14)$$

$$Q_n(i)=Q_{n-1}(i-1)(n\neq 1,3,4,15,16,31). \quad (15)$$

An EDC error detection factor, which is appended to the data stream, is the ordered sequence of bit values remaining in the LFSR shown in FIG. 6 after the entire data stream has passed through the LFSR. This sequence may be characterized as a remainder of the data stream of values S(x) modulo a selected divisor polynomial G(x).

The data stream S(x) of values will consist of 1032 two-byte codewords, which may be arranged as a 24×43 array of bytes, as illustrated in FIG. 2. Four bytes, representing an EDC factor for error detection, are appended to and depend upon the values of the data stream.

The EDC error detection factor discussed in the preceding is computed bit-by-bit. The EDC factor can also be computed one byte or, preferably, one word (two bytes) at a time, with appropriate changes in the normal (bit-by-bit) procedure. Where the EDC factor is computed one word at a time, the EDC error detection bits d[k], numbered k=0, 1, 2, . . . 31 from LSB to MSB, are defined as follows.

$$d[0] = q[31]\oplus q[30]\oplus q[29]\oplus q[28]\oplus q[27]\oplus q[26]\oplus q[25]\oplus$$
$$q[24]\oplus q[23]\oplus q[22]\oplus q[21]\oplus q[20]\oplus q[19]\oplus q[18]\oplus q[17]\oplus$$
$$q[16]\oplus B[15]\oplus B[14]\oplus B[13]\oplus B[12]\oplus B[11]\oplus B[10]\oplus B[9]\oplus$$
$$B[8]\oplus B[7]\oplus B[6]\oplus B[5]\oplus B[4]\oplus B[3]\oplus B[2]\oplus B[1]\oplus B[0],$$

$$d[1]=q[16]\oplus B[15],$$

$$d[2]=q[17]\oplus B[14],$$

$$d[3] = q[31]\oplus q[30]\oplus q[29]\oplus q[28]\oplus q[27]\oplus q[26]\oplus q[25]\oplus$$
$$q[24]\oplus q[23]\oplus q[22]\oplus q[21]\oplus q[20]\oplus q[19]\oplus q[17]\oplus$$
$$q[16]\oplus B[15]\oplus B[14]\oplus B[12]\oplus B[11]\oplus B[10]\oplus B[9]\oplus$$
$$B[8]\oplus B[7]\oplus B[6]\oplus B[5]\oplus B[4]\oplus B[3]\oplus B[2]\oplus B[1]\oplus B[0],$$

$$d[4]=q[19]\oplus q[16]\oplus B[15]\oplus B[12],$$

$$d[5]=q[20]\oplus q[17]\oplus B[14]\oplus B[11],$$

$$d[6]=q[21]\oplus q[18]\oplus B[13]\oplus B[10],$$

$$d[7]=q[22]\oplus q[19]\oplus B[12]\oplus B[9],$$

$$d[8]=q[23]\oplus q[20]\oplus B[11]\oplus B[8],$$

$$d[9]=q[24]\oplus q[21]\oplus B[10]\oplus B[7],$$

$$d[10]=q[25]\oplus q[22]\oplus B[9]\oplus B[6],$$

$$d[11]=q[26]\oplus q[23]\oplus B[8]\oplus B[5],$$

$$d[12]=q[27]\oplus q[24]\oplus B[7]\oplus B[4],$$

$$d[13]=q[28]\oplus q[25]\oplus B[6]\oplus B[3],$$

$$d[14]=q[29]\oplus q[26]\oplus B[5]\oplus B[2],$$

$$d[15] = q[31]\oplus q[29]\oplus q[28]\oplus q[26]\oplus q[25]\oplus q[24]\oplus$$
$$q[23]\oplus q[22]\oplus q[21]\oplus q[20]\oplus q[19]\oplus q[18]\oplus q[17]\oplus$$
$$q[16]\oplus B[15]\oplus B[14]\oplus B[13]\oplus B[12]\oplus B[11]\oplus B[10]\oplus$$
$$B[9]\oplus B[8]\oplus B[7]\oplus B[6]\oplus B[5]\oplus B[3]\oplus B[2]\oplus B[0],$$

$$d[16]=q[31]\oplus q[28]\oplus q[16]\oplus q[0]\oplus B[15]\oplus B[3]\oplus B[0],$$

$$d[17]=q[29]\oplus q[17]\oplus q[1]\oplus B[14]\oplus B[2],$$

$$d[18]=q[30]\oplus q[18]\oplus q[2]\oplus B[13]\oplus B[1],$$

$$d[19]=q[31]\oplus q[19]\oplus q[3]\oplus B[12]\oplus B[0],$$

$$d[20]=q[20]\oplus q[4]\oplus B[11],$$

$$d[21]=q[21]\oplus q[5]\oplus B[10],$$

$$d[22]=q[22]\oplus q[6]\oplus B[9],$$

$$d[23]=q[23]\oplus q[7]\oplus B[8],$$

$$d[24]=q[24]\oplus q[8]\oplus B[7],$$

$$d[25]=q[25]\oplus q[9]\oplus B[6],$$

$$d[26]=q[26]\oplus q[10]\oplus B[5],$$

$$d[27]=q[27]\oplus q[11]\oplus B[4],$$

$$d[28]=q[28]\oplus q[12]\oplus B[3],$$

$$d[29]=q[29]\oplus q[13]\oplus B[2],$$

$$d[30]=q[30]\oplus q[14]\oplus B[1],$$

$$d[31] = q[30]\oplus q[29]\oplus q[28]\oplus q[27]\oplus q[26]\oplus q[25]\oplus q[24]\oplus$$
$$q[23]\oplus q[22]\oplus q[21]\oplus q[20]\oplus q[19]\oplus q[18]\oplus q[17]\oplus q[16]\oplus$$
$$q[15]\oplus B[15]\oplus B[14]\oplus B[13]\oplus B[12]\oplus B[11]\oplus B[10]\oplus$$
$$B[9]\oplus B[8]\oplus B[7]\oplus B[6]\oplus B[5]\oplus B[4]\oplus B[3]\oplus B[2]\oplus B[1].$$

Figure 7:
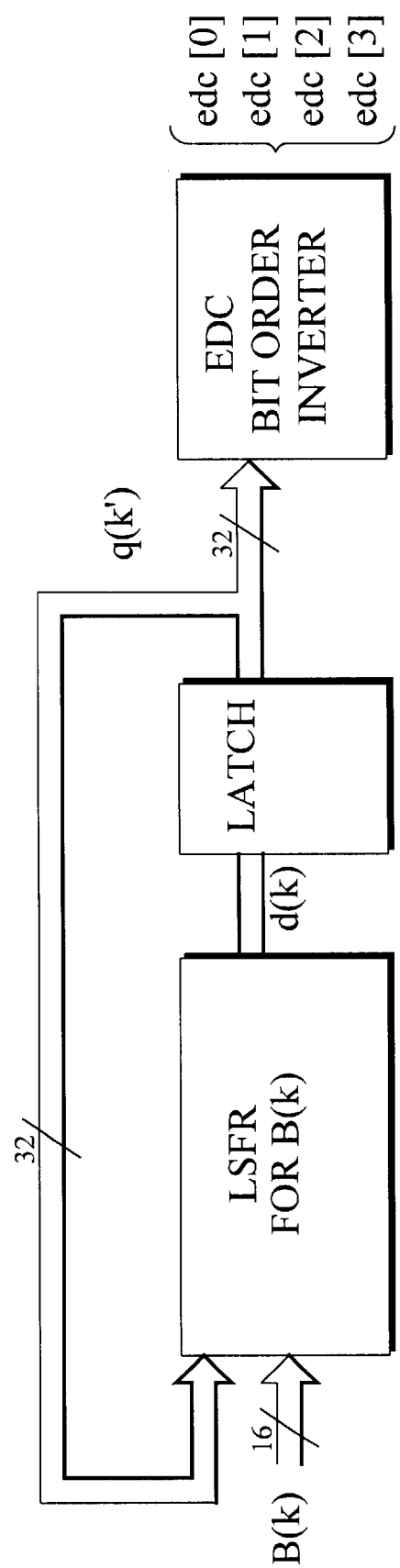

Four EDC bytes, edc[m] (m=0, 1, 2, 3) can be generated as indicated in FIG. 7, where edc[m] has the following eight-bit sequence:

$$edc[m]=\{d[8\cdot m+0],d[8\cdot m+1],d[8\cdot m+2],d[8\cdot m+3],d[8\cdot m+4],$$
$$d[8\cdot m+5], d[8\cdot m+6],d[8\cdot m+7]\}. \quad (16)$$

The ordered sequence of 32 bit values remaining in the LFSR, after the data bits B[k] are all passed through the apparatus and through an EDC bit order inverter, is the 32-bit EDC factor, where 16 consecutive bits (a word) are processed consecutively for EDC purposes.

Aram Perez, in "Byte-wise CRC Calculations", I.E.E.E. Micro, June 1983, pp. 40–46, presents analysis of a 16-bit linear feedback shift register and an associated 16th degree CRC polynomial, $G(x)=x^{16}+x^{15}+x^2+1$, that can be used to provide byte-wise, rather than bit-wise, CRC calculations. For a 16-bit LFSR array, configured according to the CRC polynomial above, the upper eight component registers ($R_9$–$R_{16}$) have contents such as $x1 \oplus x2 \oplus x3 \oplus x4 \oplus x5 \oplus x6 \oplus x7 \oplus x8$, $x1 \oplus x2 \oplus x3 \oplus x4 \oplus x5 \oplus x6 \oplus x7$, and $xm \oplus x(m+1)$ (m=2, 3, 4, 5, 6), where $xk=C_k \oplus M_k$ is the Exclusive-Or combination of an initial register bit value $C_k$ and an input bit value $M_k$. The lower eight component registers ($R_1$–$R_8$) contain terms such as $x1 \oplus x2 \oplus C_{16}$, $x1 \oplus C_{15}$, $C_m$ (m=10, 11, 12, 13, 14) and $x1 \oplus x2 \oplus x3 \oplus x4 \oplus x5 \oplus x6 \oplus x7 \oplus x8$. Using the developed formalism, the author infers that a CRC calculation can be performed on eight bits (one byte) at a time by pre-loading appropriate values into the registers and into the data input queue ($M_k$).

Byte-wise, rather than bit-wise, CRC calculations may be implemented in the registers $R_9$–$R_{16}$ registers in the following manner. The bit combinations for the upper eight component registers are prepared in parallel and are positioned at the input terminals of the registers $R_9$ through $R_{16}$. In the next time cycle for processing one bit, these input values are loaded into the registers $R_9$ through $R_{16}$. This achieves the equivalent of a byte-wise CRC calculation in a time corresponding to processing of one bit. This technique can be extended to word-wise CRC calculations, handling 16 bits or one word at a time, by making use of a 32nd degree CRC polynomial, such as the polynomial $G1(x) \oplus G2(x)$, where $G1(x)$ and $G2(x)$ are 16th degree divisor polynomials. Use of byte-wise or word-wise CRC calculations rather than the standard bit-wise CRC calculations provides extra time savings.

The procedure discussed herein has been extended to M×N arrays of data elements $\{s(n1+N \cdot n2) | 0 \leq n1 \leq N-1; 0 \leq n2 \leq M-1\}$ from the particular choices M=24 and N=43. This invention allows the system to read in each element in the data array once, receive the data element at the EDC processor and at the ECC processor, and process the data element in parallel to compute the EDC error detection term and components of the ECC checkbytes c0 and c1.

The particular 32nd degree divisor polynomial used in the EDC processor and set forth in the relation (12) can be replaced by any other suitable 32-bit divisor polynomial. In particular, the 16th degree CRC-16 polynomial in the primitive relation (1) can be replaced by another suitable polynomial, such as $G3(x)=x^{16}+x^{12}+x^5+1$, $G4(x)=x^{16}+x^{12}+x^2+1$, $G5(x)=x^{16}+x^{14}+x+1$, $G6(x)=x^{16}+x^{11}+x^4+1$, or $G7(x)=x^{16}+1$. The 32nd degree divisor can also be used to implement apparatus that performs word-wise (or, if preferred, byte-wise) CRC calculations for the EDC factor used for error detection.

The flow chart shown in each of FIG. 4 and FIG. 5 may also be characterized as a first sequence of operations carried out on the contents of a first computer register, a second sequence of operations carried out on the contents of a second computer register, and a third sequence of operations carried out on the contents of a third computer register, where the first register is optionally part of an EDC processor and the second and third registers each hold an eight-bit array and are optionally part of an ECC processor. In this characterization, three registers (each 16-bit), and three memory arrays of size max(M,N) are needed to implement the invention, and each data element is read in only once for processing for EDC purposes and for ECC-P-parity purposes.

What is claimed is:

1. A method of processing data for error control purposes, the method comprising:

receiving each of a sequence of data elements s(k) once, each having an upper byte $s(k)_U$ and a lower byte $s(k)_L$, with k=n1+N·n2, where $0 \leq n1 \leq N-1$, $0 \leq n2 \leq M-1$, and M and N are selected positive integers;

forming a first sequence of partial sums PS1 of the data elements s(n1+N·n2), summed over the integers n1 and n2 with ranges $0 \leq n1 \leq N-1$; and $0 \leq n2 \leq M-1$;

forming a second sequence {s0[n1]} of terms, each equal to a sum, over the integer n2 with the range $0 \leq n2 \leq M-1$, of the data elements s(n1+N·n2) for each integer n1, and storing each element of the second sequence;

contemporaneous with formation of the second sequence, forming a third sequence, {s1[n1]} of terms, each equal to a sum, over the integer n2 with the range $0 \leq n2 \leq M-1$, of the data elements $\alpha^{M-n2-} \cdot s(n1+N \cdot n2)$ for each integer n1, where $\alpha^h$ is a selected power of a selected eight-bit array $\alpha$ that satisfies a selected polynomial equation $p(\alpha)=0$, and storing each element of the third sequence;

computing an EDC error detection factor using at least one member of the first sequence;

interpreting the second sequence and the third sequence as elements of a first syndrome sequence and of a second syndrome sequence, respectively, for ECC P-parity correction;

forming a first checkbyte sequence, equal to a sum $\alpha k0 \cdot s0[n1] + \alpha^{k1} \cdot s1[n1]$, and a second checkbyte sequence, equal to a sum $\alpha^{k2} \cdot s0[n1] + \alpha^{k3} \cdot s1[n1]$, where k0, k1, k2 and k3 are selected non-negative integers, not dependent upon the integer n1; and using the first and second checkbyte sequences to determine whether at least one error is present in the sequence of data elements s(k) (k=n1+N·n2; $0 \leq n1 \leq N-1$; $0 \leq n2 \leq M-1$).

2. The method of claim 1, further comprising: using said first and second checkbyte sequences to determine if said at least one error is present in ECC P-parity for said sequence of data elements s(k).

3. The method of claim 1, further comprising: selecting said integer N=43.

4. The method of claim 1, further comprising: selecting said integer M =24.

5. The method of claim 1, wherein said process of computing said EDC factor comprises:

computing a remainder of said selected partial sum PS1 of said first sequence, modulo a selected divisor polynomial; and augmenting said selected partial sum PS1 by the remainder.

6. The method of claim 5, wherein said process of computing said remainder of said first partial sum comprises: using at least one of (i) byte-wise computation of said remainder and (ii) word-wise computation of said remainder.

7. A method of processing data for error control purposes, the method comprising:

receiving each of a sequence of data elements s(k) once, each having an upper byte $s(k)_U$ and a lower byte $s(k)_L$, with k=n1+N·n2, where $0 \leq n1 \leq N-1$, $0 \leq n2 \leq M-1$, and M and N are selected positive integers, at a first computer register and forming a first sequence of partial sums PS1 of s(n1+N·n2), summed over the integers nI and n2, with ranges $0 \leq n1 \leq N-1$ and $0 \leq n2 \leq M-1$;

receiving the sequence of data elements at a second computer register, forming a second sequence, {s0[n1]} of terms, each equal to a sum, over the integer n2 with the range $0 \leq n2 \leq M-1$, of the data elements $s(n1+N \cdot n2)$ for each integer n1 and storing each element of the second sequence;

contemporaneous with formation of the second sequence, receiving the sequence of data elements at a third register, forming a third sequence, {s1[n1]} of terms, each equal to a sum, over the integer n2 with the range $0 \leq n2 \leq M-1$, of the data elements $\alpha^{M-n2-1} \cdot s(n1+N \cdot n2)$ for each integer n1, where $\alpha^h$ is a selected power of a selected eight-bit array $\alpha$ that satisfies a selected polynomial equation $p(\alpha)=0$, and storing each element of the third sequence;

computing an EDC error detection factor using at least one member of the first sequence;

interpreting the second sequence and the third sequence as elements of a first syndrome sequence and of a second syndrome sequence, respectively, for ECC P-parity correction;

forming a first checkbyte sequence, equal to a sum $\alpha^{k0} \cdot s0[n1]+\alpha^{k1} \cdot s1[n1]$, and a second checkbyte sequence, equal to a sum $\alpha^{k2} \cdot s0[n1]+\alpha^{k3} \cdot s1[n1]$, where k0, k1, k2 and k3 are selected non-negative integers, not dependent upon the integer n1; and using the first and second checkbyte sequences to determine whether at least one error is present in the sequence of data elements $s(k)$ ($k=n1+N \cdot n2$; $0 \leq n1 \leq N-1$; $0 \leq n2 \leq M-1$).

8. The method of claim 7, further comprising: using said first and second checkbyte sequences to determine if said at least one error is present in ECC P-parity for said sequence of data elements s(k).

9. The method of claim 7, further comprising: selecting said integer N=43.

10. The method of claim 7, further comprising: selecting said integer M=24.

11. The method of claim 7, wherein said process of computing said EDC factor comprises:

computing a remainder of said selected partial sum PS1 of said first sequence, modulo a selected divisor polynomial; and augmenting said selected partial sum PS1 by the remainder.

12. The method of claim 11, wherein said process of computing said remainder of said first partial sum comprises: using at least one of (i) byte-wise computation of said remainder and (ii) word-wise computation of said remainder.

13. A system for processing data for error control purposes, the system comprising a computer that is programmed:

to receive each of a sequence of data elements s(k) once, each having an upper byte $s(k)_U$ and a lower byte $s(k)_L$, with $k=n1+N \cdot n2$, where $0 \leq n1 \leq N-1$, $0 \leq n2 \leq M-1$, and M and N are selected positive integers;

to form a first sequence of partial sums PS1 of the data elements $s(n1+N \cdot n2)$, summed over the integers n1 and n2 with ranges $0 \leq n1 \leq N-1$; and $0 \leq n2 \leq M-1$;

to form a second sequence {s0[n1]} of terms, each equal to a sum, over the integer n2 with the range $0 \leq n2 \leq M-1$, of the data elements $s(n1+N \cdot n2)$ for each integer n1, and to store each element of the second sequence;

contemporaneous with formation of the second sequence, to form a third sequence, {s1[n1]} of terms, each equal to a sum, over the integer n2 with the range $0 \leq n2 \leq M-1$, of the data elements $\alpha^{M-n2-1} \cdot s(n1+N \cdot n2)$ for each integer n1, where $\alpha^h$ is a selected power of a selected eight-bit array $\alpha$ that satisfies a selected polynomial equation $p(\alpha)=0$, and to store each element of the third sequence;

to compute an EDC error detection factor using at least one member of the first sequence;

to interpret the second sequence and the third sequences as elements of a first syndrome sequence and of a second syndrome sequence, respectively, for ECC P-parity correction;

to form a first checkbyte sequence, equal to a sum $\alpha^{k0} \cdot s0[n1]+\alpha^{k1} \cdot s1[n1]$, and a second checkbyte sequence, equal to a sum $\alpha^{k2} \cdot s0[n1]+\alpha^{k3} \cdot s1[n1]$, where k0, k1, k2 and k3 are selected non-negative integers, not dependent upon the integer n1; and to use the first and second checkbyte sequences to determine whether at least one error is present in the sequence of data elements $s(k)$ ($k=n1+N \cdot n2$; $0 \leq n1 \leq N-1$; $0 \leq n2 \leq M-1$).

14. The system of claim 13, wherein said computer is further programmed to use said first and second checkbyte sequences to determine if said at least one error is present in ECC P-parity for said sequence of data elements s(k).

15. The system of claim 13, wherein said computer is further programmed to select said integer N=43.

16. The system of claim 13, wherein said computer is further programmed to select said integer M=24.

17. The system of claim 13, wherein said computer is further programmed to compute said EDC factor by a procedure comprising:

computing a remainder of said selected partial sum PS1 of said first sequence, modulo a selected divisor polynomial; and augmenting said selected partial sum PS1 by the remainder.

18. The system of claim 17, wherein said computer is further programmed to compute said remainder of said first partial sum comprises using at least one of (i) byte-wise computation of said remainder and (ii) word-wise computation of said remainder.

19. A system for processing data for error control purposes, the system comprising a computer that is programmed:

to receive each of a sequence of data elements s(k) once, each having an upper byte $s(k)_U$ and a lower byte $s(k)_L$, with $k=n1+N \cdot n2$, where $0 \leq n1 \leq N-1$, $0 \leq n2 \leq M-1$, and M and N are selected positive integers, at a first computer register and to form a first sequence of partial sums PS1 of $s(n1+N \cdot n2)$, summed over the integers n1 and n2, with ranges $0 \leq n1 \leq N-1$ and $0 \leq n2 \leq M--1$;

to receive the sequence of data elements at a second computer register, forming a second sequence, {s0[n1]} of terms, each equal to a sum, over the integer n2 with the range $0 \leq n2 \leq M-1$, of the data elements $s(n1+N \cdot n2)$ for each integer n1, and to store each element of the second sequence;

contemporaneous with formation of the second sequence, to receive the sequence of data elements at a third register, forming a third sequence, {s1[n1]} of terms, each equal to a sum, over the integer n2 with the range $0 \leq n2 \leq M-1$, of the data elements $\alpha^{M-n2-1} \cdot s(n1+N \cdot n2)$ for each integer ni, where $\alpha^h$ is a selected power of a selected eight-bit array of that satisfies a selected polynomial equation $p(\alpha)=0$, and to store each element of the third sequence;

to compute an EDC error detection factor using at least one member of the first sequence;

to interpret the second sequence and the third sequence as elements of a first syndrome sequence and of a second syndrome sequence, respectively, for ECC P-parity correction;

to form a first checkbyte sequence, equal to a sum $\alpha^{k0} \cdot s0[n1] + \alpha^{k1} \cdot s1[n1]$, and a second checkbyte sequence, equal to a sum $\alpha^{k2} \cdot s0[n1] + \alpha^{k3} \cdot s1[n1]$, where k0 k1, k2 and k3 are selected non-negative integers, not dependent upon the integer n1; and to use the first and second checkbyte sequences to determine whether at least one error is present in the sequence of data elements s(k) (k=n1+N·n2; $0 \leq n1 \leq N-1$; $0 \leq n2 \leq M-1$).

20. The system of claim 19, wherein said computer is further programmed to use said first and second checkbyte sequences to determine if said at least one error is present in ECC P-parity for said sequence of data elements s(k).

21. The system of claim 19, wherein said computer is further programmed to select said integer N=43.

22. The system of claim 19, wherein said computer is further programmed to select said integer M=24.

23. The system of claim 19, wherein said computer is further programmed to compute said EDC factor by a procedure comprising:

computing a remainder of said selected partial sum PS1 of said first sequence, modulo a selected divisor polynomial; and augmenting said selected partial sum PS1 by the remainder.

24. The system of claim 23, wherein said computer is further programmed to compute said remainder of said first partial sum comprises using at least one of (i) byte-wise computation of said remainder and (ii) word-wise computation of said remainder.

* * * * *